United States Patent [19]

Nemoto

[11] Patent Number: 5,204,650
[45] Date of Patent: Apr. 20, 1993

[54] SWITCH FOR CONTROLLING CURRENT FLOW IN SUPERCONDUCTORS

[75] Inventor: Kaoru Nemoto, Tokyo, Japan

[73] Assignee: Railway Technical Research Institute, Tokyo, Japan

[21] Appl. No.: 692,255

[22] Filed: Apr. 26, 1991

[30] Foreign Application Priority Data

Apr. 27, 1990 [JP] Japan ................. 2-46524[U]

[51] Int. Cl.⁵ .................................. H01F 1/00
[52] U.S. Cl. ........................... 335/216; 335/299; 338/32 S; 505/1; 505/879
[58] Field of Search ............ 335/299, 216; 338/25, 338/325; 505/1, 813, 881, 879, 860; 307/462

[56] References Cited

U.S. PATENT DOCUMENTS

| 3,732,438 | 5/1973 | Wright . |
| 4,586,017 | 4/1986 | Laskaris et al. . |
| 4,803,456 | 2/1989 | Benesch .................. 505/860 X |

FOREIGN PATENT DOCUMENTS

| 350916A2 | 1/1990 | European Pat. Off. . |
| 49-69288 | 7/1974 | Japan . |
| 56-26993B2 | 6/1981 | Japan . |
| 57-92723A | 6/1982 | Japan . |
| 59-88882 | 5/1984 | Japan ................... 335/216 |
| 60-94784 | 5/1985 | Japan . |
| 60-100487A | 6/1985 | Japan . |
| 3-74886 | 3/1991 | Japan . |

OTHER PUBLICATIONS

Abstract of Japanese Patent Publication JP-A-3 074 886.

Y. Jizo et al., "Development of High Electrical Resistance Persistent Current Switch for High Speed Energization System," Proc. Internt'l Conference on Maglev & Linear Drives, Vancouver, 1986, pp. 219-225.

*Primary Examiner*—Leo P. Picard
*Assistant Examiner*—Trinidad Korka
*Attorney, Agent, or Firm*—Finnegan, Henderson, Farabow, Garrett and Dunner

[57] ABSTRACT

A superconductive switch is provided with a pair of superconductive routes which are wound around a cylindrical core in a bifilar fashion. One superconductive wire is constituted of a pair of superconductive routes. The superconductive routes are twisted around each other at a uniform pitch. By virtue of the twisting, electromagnetic force which may exerted in the superconductive wires cancel each other, so that the wire-movement of the superconductive wire is restrained. Accordingly, the electrical current flowing through the superconductive switch can be increased.

26 Claims, 12 Drawing Sheets

← :Direction of Current Flow

←: Direction of Current Flow
⇐: Direction of Electromagnetic Force

← :Direction of Current Flow

SWITCH FOR CONTROLLING CURRENT FLOW IN SUPERCONDUCTORS

BACKGROUND OF THE INVENTION

The present invention relates to switches having bifilar-fashioned superconducting routes for controlling the flow of current through superconductors, and utilizes the change between the superconducting state and the nonsuperconducting state of the superconducting routes as the switching mechanism. These switches may preferably be used in conjunction with superconductive coils for magnetic levitating trains, magnetic resonance imaging apparatuses, and the like.

Electrical switches such as those described above are conventionally utilized in conjunction with superconductive coils used for magnetic levitating trains, magnetic resonance imaging apparatuses, and the like, in order to deliver a constant flow of electric current over a long period.

Most superconductive switches are categorized into one of two types. One type utilizes mechanical movement for the opening and closing of the switches, such as by contact and breaking of contact of contact points. The other type is a temperature-dependent type of switch utilizing changes of conducting state of superconductive wires by means of temperature change, i.e., the temperature-dependent type superconductive switches function by switching between the normal conductive condition (resistant to the flow of electrical current), and the superconductive condition (not resistant to the flow of electrical current) of the superconductive wires so as to open and close the switches. At present, by virtue of light weight (and thus ease of handling) and since the conducting resistance is comparatively low when the switch is in the closed condition, the majority of superconducting switches employed are of the temperature-dependent type.

In order to produce light and compact superconductive switches of the temperature-dependent type, and in order to enhance the current density, the superconductive wires are wound in such a manner that electromagnetic induction in the superconductive wires is minimized. In such structures, the magnetic fields generated by the superconductive switches themselves are reduced, and the critical current density which can flow through the superconductive wires is increased. More specifically, in the temperature-dependent type of superconductive switches of the prior art, as shown in FIGS. 1 and 2, superconductive wire 1 is wound around a cylindrical core 2 in a bifilar fashion. Such a superconductive switch is disclosed in Japanese Patent Application Publication (B2) No. 56-26993. In this case, two superconductive routes 1a and 1b terminate at terminals 1c, and the terminal 1c of one superconductive route is unitary with the terminal 1c of the other superconductive route, thereby constituting one superconductive wire 1. These superconductive routes 1a and 1b are wound around the core 2 at a uniform pitch in such a manner that the two superconductive routes 1a and 1b are in contact with each other over the entirety of the winding. The superconductive routes 1a and 1b are connected to the positive and the negative terminals of an external device, respectively, so that the electric current flows from route 1a to route 1b. The switching-off operation of the superconductive switch is accomplished by activating heater line 3 which heats the superconductive routes 1a and 1b; whereas the switching-on operation is achieved by means of cooling the routes 1a and 1b with liquid helium or other coolant, depending on the critical temperature of the superconductive material used in routes 1a and 1b. In FIG. 1, a receiving material 4 for receiving liquid helium, and a casing 5 for protecting the internal structure are shown by dotted lines (illustration of the heater line 3, receiving material 4, and casing 5 is omitted from FIG. 2).

Conventionally, for the material of the superconductive wire 1, a Nb-Ti alloy is selected for the superconductive material in order that a high density of electric current flow is assured when the superconductive switch is ON. In this case, the Nb-Ti alloy is formed into a large number of ultrafine superconductive filaments having diameters of a few μm, and the filaments are arranged lengthwise in the superconductive wire 1. On the other hand, a relatively electrically resistive material, for example, a Cu-Ni alloy, is selected for the matrix of the superconductive wire 1, which substantially insulates respective superconductive filaments from one another, in order to ensure high resistance when the switch is OFF. However, such relatively resistive material does not contribute to stabilizing the superconducting properties of the superconductive wire relative to the conductive material, e.g., Al or Cu. Thus, an undesirable instability in the aforementioned superconductive wire may occur in which the probability is high that the state may change from the superconducting state to the normal conductive state (resistive state) when electric current flows through the wire. That is, if a relatively electrically-resistive material is used as the matrix of the superconductive wire 1, it is not possible for an excess of current to escape to the matrix from the internal superconductive filaments inside of the wire 1. Therefore, a portion of the internal superconductive filaments may change to the normal state even if a small unexpected heat disturbance occurs, and additional heat may be generated by this state change. The heat may then cause the propagation of this effect throughout the entire superconductive wire 1, turning the superconductive switch into the OFF condition at an unexpected time.

If such a wire includes a large number of superconductive filaments, and thus, has a critical current much larger than the normal operating current, the incidence of the aforementioned undesirable phenomenon can be decreased. However, if the number of superconductive filaments is increased, a corresponding increase in the cost, mass, and size of the superconductive switch may be required.

Therefore, in order to produce a light and compact superconductive switch at a reasonable price, while ensuring that the superconductive switch does not change from the non-resistive condition to the resistive condition at an unexpected time, such heat disturbances should be prevented. It is suspected that such heat disturbances are primarily caused by small amounts of heat generated by small electromagnetically-induced movements of the wire (in the range of a few μm). Conventionally, attempts have been made to restrain this kind of wire-movement by setting the wires in a resin material, such as epoxy-resin.

At present, these superconductive switches are sometimes utilized in strong magnetic fields, especially when the switches are connected to superconductive coils for magnetic levitating trains or for magnetic resonance imaging apparatuses. For example, as illustrated by arrow A in FIG. 2, the superconductive switch receives magnetic force along the axial direction thereof. In this case, once the current flows into the superconductive switch, the route 1a, which conducts the electric current, is depressed radially inwardly with respect to the core 2 according to Fleming's left-hand rule. At the same time, the route 1b, which returns the electric current, is forced radially outwardly and away from the core 2 in directions opposite to that of the route 1a. In other words, in the conventional superconductive switch in which the routes 1a and 1b are simply wound in a bifilar fashion, wire-movement is likely to occur due to the above-described opposing electromagnetic forces.

As mentioned above, if the superconductive wires are impregnated in a resin material, and if the opposing electromagnetic forces are small, the superconductive wire may be held immobile by virtue of the adhesive force of the resin material overcoming the electromagnetic forces, thus restraining the movement of the wire. However, the adhesive force of the resin material is limited. If the electromagnetic forces are large, the wire-movement may not be prevented. In particular, if the switch is cooled to $-269°$ C. (4.2K, the boiling point of liquid helium) after the wire was impregnated in the resin material at room temperature, the routes 1a and 1b will likely separate from each other because of a difference in the thermal-shrinkage ratios of the superconductive wire and the resin material. Once wire-movement commences, heat is generated by the spiral current in the matrix of the wire and by the friction between the adjoining superconductive routes, and in addition, heat is generated due to release of stress when the superconductive wire separates from the resin material, and also due to friction between the wire and the resin materials. As a result, even if the superconductive wire is impregnated in a resin material, current flow may be unstable due to heart generated by one or more of the above mechanisms. In this case, the superconductive switch will change to the normal conductive state (resistive state) at a current level less than the half of the critical current.

SUMMARY OF THE INVENTION

It is therefore an object of the present invention to provide a superconductive switch in which the wire-movement is restrained.

In accordance with one aspect of the present invention, a superconductive switch comprises at least one pair of superconductive routes wound around a core. The superconductive routes constitutes a loop in a superconducting wire, electric current flowing and reciprocating in opposite directions through the respective superconductive routes. In the present invention, the pair of superconductive routes are twisted around each other.

With such a structure, even if the superconductive switch is subjected to a strong magnetic field from an external magnetic source, opposing electromagnetic forces exerted in the superconductive route cancel each other by virtue of the superconductive routes being twisted around each other. That is, in each twist pitch, each superconductive route restrain the movement of the other superconductive route. Accordingly, the wire-movement caused by the electromagnetic forces are restrained.

As a result, the current flow of the superconductive switch can be stable, that is, a large current which is close to the critical current of the superconductive wire can be allowed to flow through the superconductive switch for long periods. In addition, the improvement of the electrical feature and the ease of manufacturing the superconductive switch allows the production of a light and compact superconductive switch at a reasonable cost. Also, since the wire-movement is restrained in the present invention, the opportunity for the superconductive switch to change unexpectedly to the normal conductive condition (resistive condition) will be markedly reduced. Therefore, the reliability of the superconductive switch is enhanced.

Other features and advantages of the present invention will be understood more clearly in the following detailed description of the preferred embodiment with reference to the accompanying drawings.

DETAILED DESCRIPTION OF THE PREFERRED EMBODIMENTS

In the following, with reference to the accompanying drawings, various preferred embodiments of the present invention will be described in detail. In the following description, the switching-on operation is achieved by means of cooling the switch with liquid helium. However, the present invention is not intended to be limited to the use of liquid helium; for example, the use of liquid nitrogen may also be applied to the present invention.

FIRST EMBODIMENT

Figure 3:
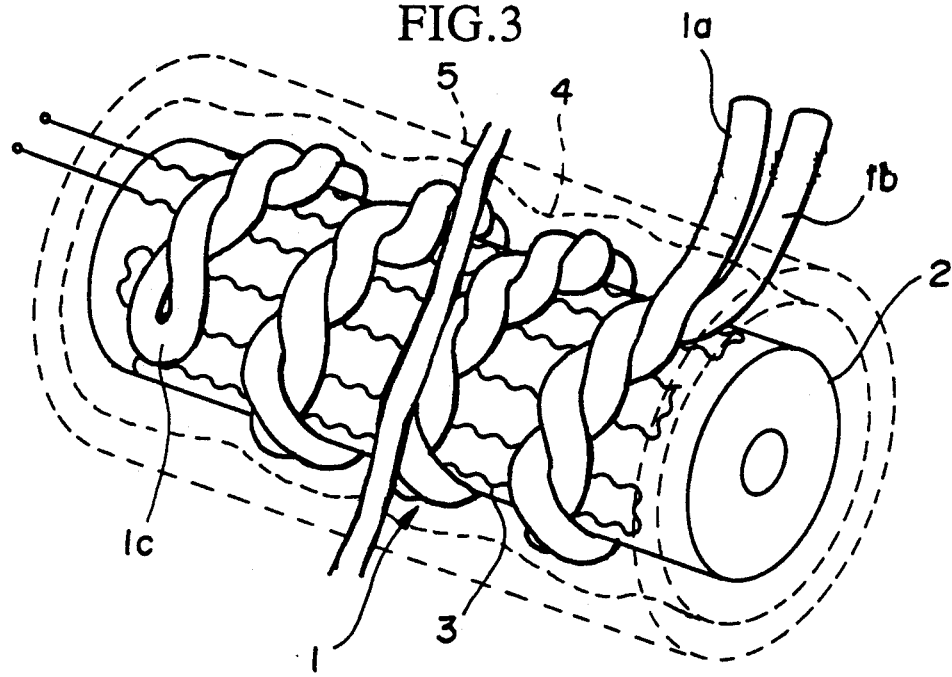
FIG. 3 is a perspective view of a superconductive switch according to a first embodiment of the present invention.
Figure 4:
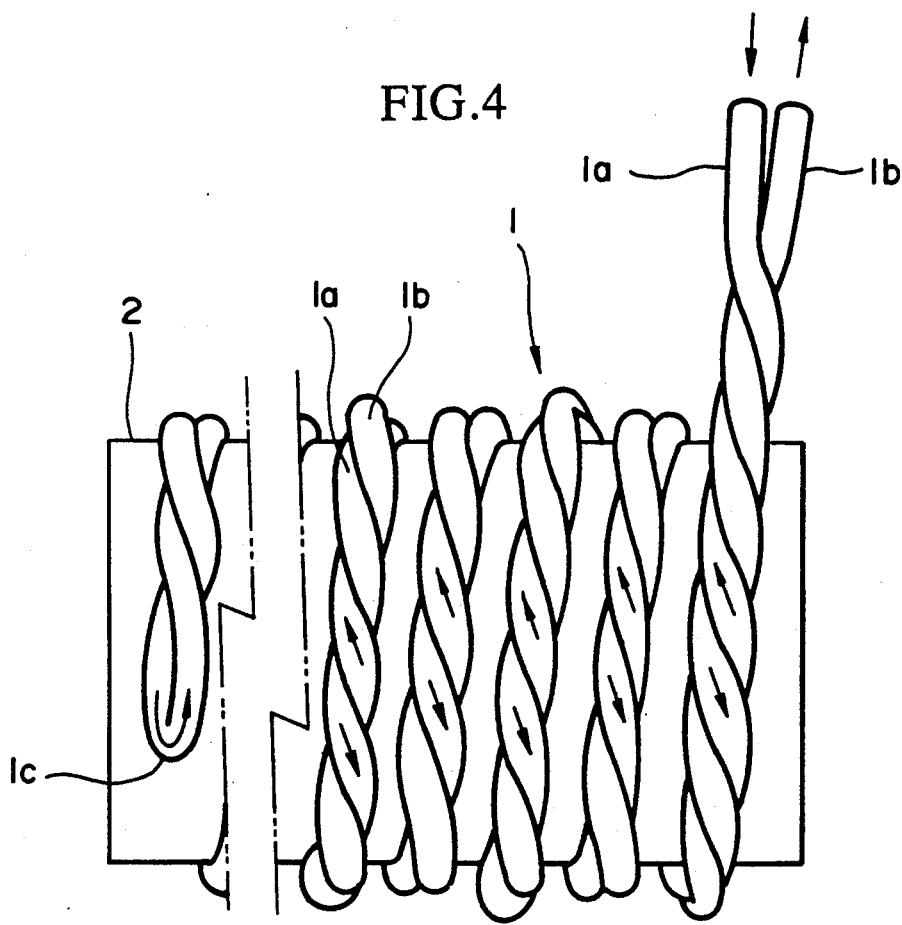
FIG. 4 is a side view of the superconductive switch, in FIG. 3, in which illustration of the heater line, the receiving material, and the casing is omitted.
Figure 5:
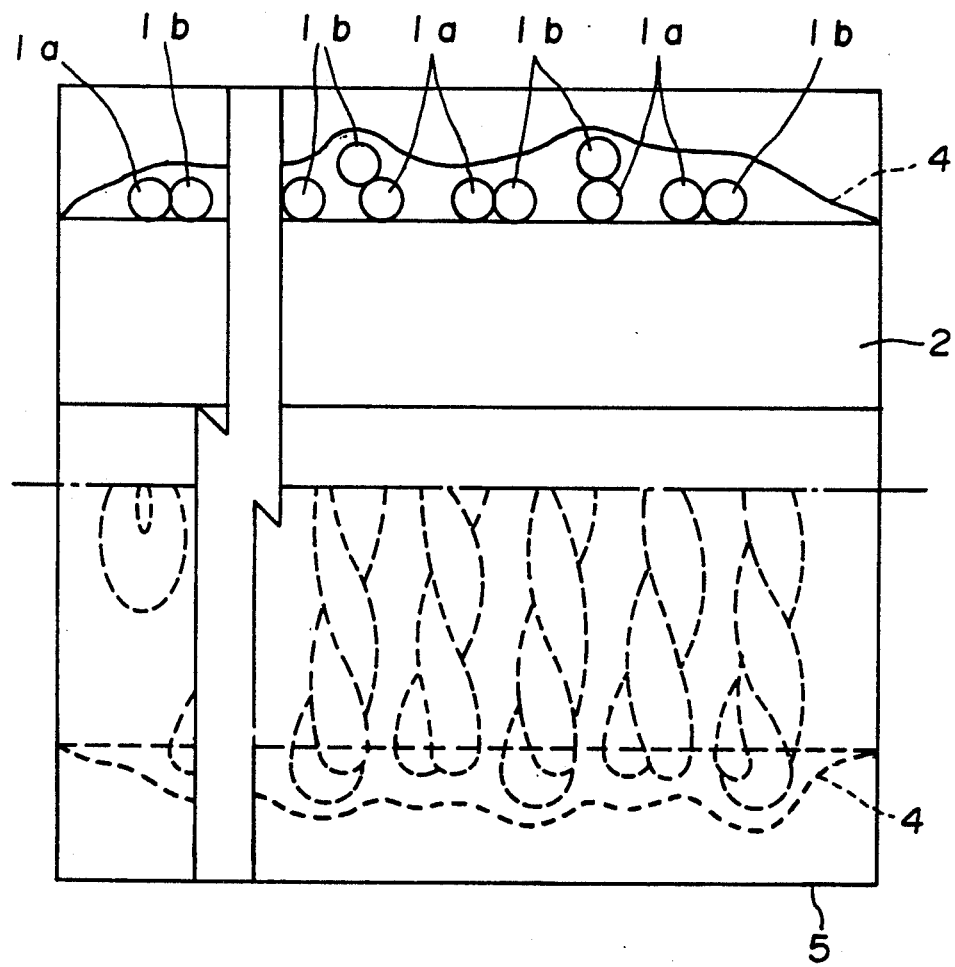
FIG. 5 is a particular side view of the superconductive switch shown in FIG. 3, in which the upper part is shown in cross section.

FIGS. 3 through 5 depict a superconductive switch in accordance with a first embodiment of the present invention. In the drawings, reference numeral 2 designates a cylindrical core of an insulator material. As shown in FIG. 3, superconductive wire 1 is wound around the cylindrical core 2. Between the cylindrical core 2 and the superconductive wire 1, heater line 3 intermediates for heating the superconductive switch in a conventional manner, as can be seen in FIG. 3. This heater line 3 is an electrical-heating line which is disposed around the cylindrical core 2 laterally and longitudinally.

Since the superconductive switch is used under extremely low-temperature conditions, the heater line 3 is manufactured of a resistive material which is not fragile at extremely low temperatures. In addition, it is preferable that the resistance value of the heater line 3 be constant regardless of the changes in temperature. In light of these requirements, the heater line 3 is made of, for example, manganin (copper-manganese alloy) or constantan (copper-nickel alloy).

Figure 6:
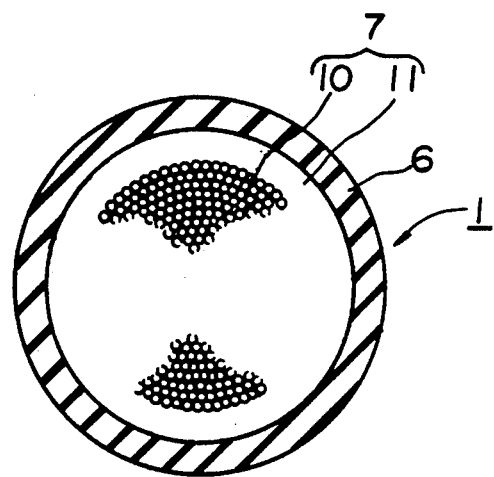
FIG. 6 is a cross section of a wire utilized in the superconductive switch in FIG. 3.

The superconductive wire 1 is constituted of a pair of superconductive routes 1a and 1b twisted around each other at a regular pitch of 5 mm. As can be seen in FIG. 6, the superconductive wire 1, which is of a circular cross section, is made of a matrix 11 of Cu-Ni or Cu, a large number of ultra-fine Nb-Ti superconductive filaments 10 impregnated therein, and an insulator material 6 surrounding the matrix 11.

In this embodiment, the diameter of the superconductive filaments 10 is 7±0.2 μm, and the number of the superconductive filaments 10 in one route 1a or 1b is 1,106. The diameter of the superconductive wire 1 is 0.3 mm. Preferably, the percentage of Ni in said Cu-Ni matrix is 5–35% by weight. In this embodiment, the percentage of Ni in said matrix 11 of Cu-Ni is 30% by weight. On the other hand, preferably, the percentage of Ti in said Nb-Ti filaments 10 is 40–55% by weight. In this embodiment, the composition ratio of Ti in said Nb-Ti filaments is 50% by weight. The critical temperature of the Nb-Ti filaments is 9K, and the critical magnetic flux density is 12 T at 4.2K. It is also possible to use Nb$_3$Sn in the superconductive filaments 10.

As illustrated in FIGS. 3 to 5, each terminal 1c of the superconductive routes 1a and 1b is unitary with the terminal 1c of the other, and thereby the routes 1a and 1b constitute a loop in one superconductive wire 1. The superconductive routes 1a and 1b are respectively connected to a positive terminals and to a negative terminal of an external device, so that electric current flows from the route 1a to route 1b.

The aforementioned insulator material 6 must be a perfect insulator, since, as can be understood from FIGS. 3 to 5, electrical current flows in opposite directions through the adjoining intertwisted superconductive routes 1a and 1b.

The twisted superconductive wire 1 is wound about 40 times around the core 2 at a uniform pitch of less than 0.7 mm. In this case, the terminations 1c of the superconductive routes 1a and 1b are in contact with the core 2. Although gaps are shown between adjacent turns of wires 1 in the drawings to clearly show the structure of the superconductive switch, it is preferable to wind the superconductive wire 1 without such gaps in order to manufacture a compact superconductive switch structure. It is expected that the pitch of winding of the superconductive wire 1 does not affect the electrical features of the superconductive switch which will be described later.

In addition, as illustrated by the dotted line in FIG. 3 and as illustrated in FIG. 5, a receiving material 4 surrounds the superconductive wire 1 for receiving liquid helium to cool the wire 1. The receiving material 4 entirely covers the cylindrical core 2 and the wire 1, except for the terminations of the routes 1a and 1b which are opposite to the terminals 1c, so that the terminations can be connected to the external device.

The receiving material 4 also must be electrically insulating. In addition, the receiving material 4 should restrain the wire-movement of the superconductive wire 1. Therefore, the receiving material 4 may be selected from epoxy-resin or grease. In this embodiment, epoxy resin is utilized for the receiving material 4.

Consequently, the aforementioned insulator material 6, which constitutes the outermost layer of the superconductive wire 1, should adhere to the receiving material 4. Therefore, the insulator material 6 is selected from polyvinylfolmal, polyamidoimide, Kevlar (polyparaphenylen terephthalic acid mono amide) fabric, nylon fabric, and so on. In this embodiment, polyvinylfolmal is used for the insulator material covering the superconductive wire 1.

Furthermore, a casing 5 is provided with the superconductive switch so as to encase the receiving material 4 for protecting the receiving material 4 and the internal structure (as illustrated by the dotted line in FIG. 3 and as illustrated in FIG. 5). The requirements and features of the casing 5 are as follows.

It is desirable that the thermal conductivity of the casing be low in order to maintain the temperature of the superconductive switch when the switch is OFF. On the contrary, it is also desirable that the thermal conductivity of the casing be high in order to cool the superconductive wire 1 rapidly. Since it is not possible that such opposite requirements be satisfied simultaneously, a compromise solution is necessary. In light of the above, a cotton-fiber-fabric-impregnated phenol resin, glass-fiber-fabric-reinforced epoxy resin, and the like, may be utilized for the casing 5.

Returning to the above-mentioned cylindrical core 2 for winding the twisted superconductive wire 1, the requirements and features are as follows.

It is desirable that the thermal conductivity of the core be low in order to maintain the temperature of the switch when the switch is OFF. On the contrary, it is also desirable that the thermal conductivity of the core be high in order to cool the superconductive wire 1 rapidly. Since it is not possible that such opposite requirements be satisfied simultaneously, a compromise solution is necessary as in the above-described casing 5. In light of the above, a cotton-fiber-fabric-impregnated phenol resin, glass-fiber-reinforced plastic material, e.g., quartz-glass-fiber-fabric reinforced epoxy resin, and the like may, be utilized for the cylindrical core 2.

In addition, it is preferable that the thermal-shrinkage ratio of the material of the cylindrical core 2 be less than that of the superconductive wire 1. Since in this case, when the switch structure is cooled by means of liquid helium, the cylindrical core 2 may not shrink as much as the wire 1, and tension may therefore increase in the superconductive wire 1 wound around the cylindrical core 2. As a result, the stability of the superconductive wire 1 on the cylindrical core is enhanced. In other words, undesirable slip between the superconductive wire 1 and the cylindrical core 2 can be prevented. Thus, quartz-glass-fiber-fabric reinforced epoxy resin, or the like, may be preferable as the material of the cylindrical core 2. The thermal-shrinkage ratio of the superconductive wire 1 between room temperature and 4.2K (the boiling point of liquid helium) is approximately $4 \times 10^{-4}$, while that of the quartz-glass-fiber-fabric reinforced epoxy resin is approximately $2 \times 10^{-4}$.

With a structure such as that in the present preferred embodiment, the resistance when the superconductive switch is open (OFF-condition) is about 25 $\Omega$.

Figure 1:
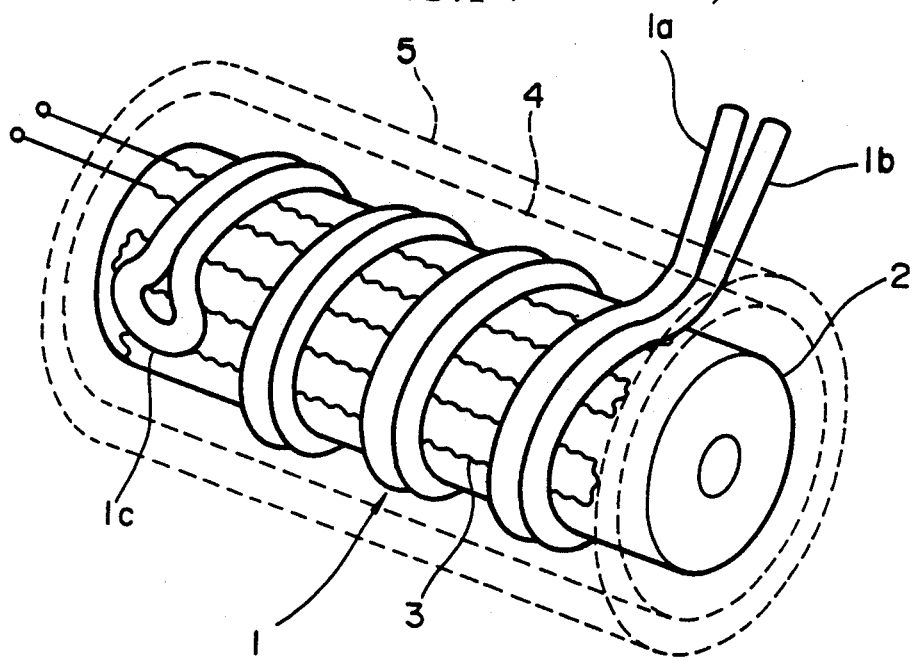
FIG. 1 is a perspective view of a superconductive switch of the prior art.
Figure 2:
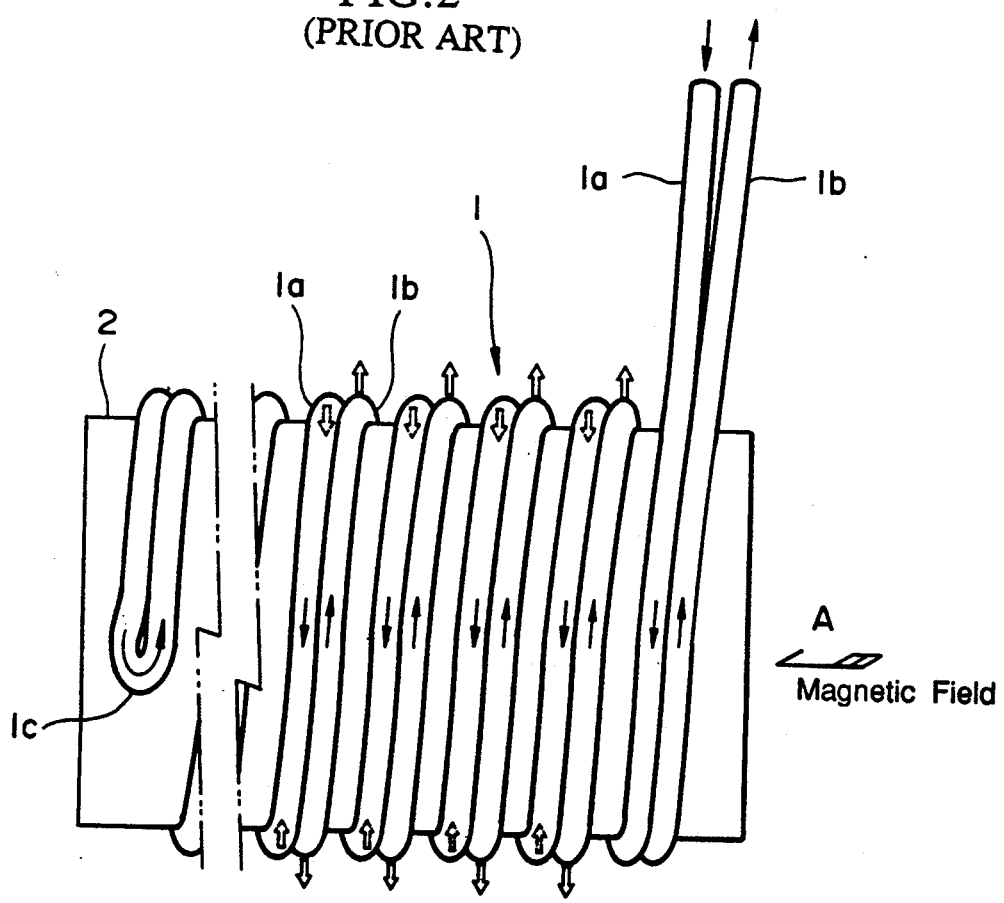
FIG. 2 is a side view of the superconductive switch in FIG. 1, in which illustration of the heater line, the receiving material, and the casing is omitted.
Figure 7:
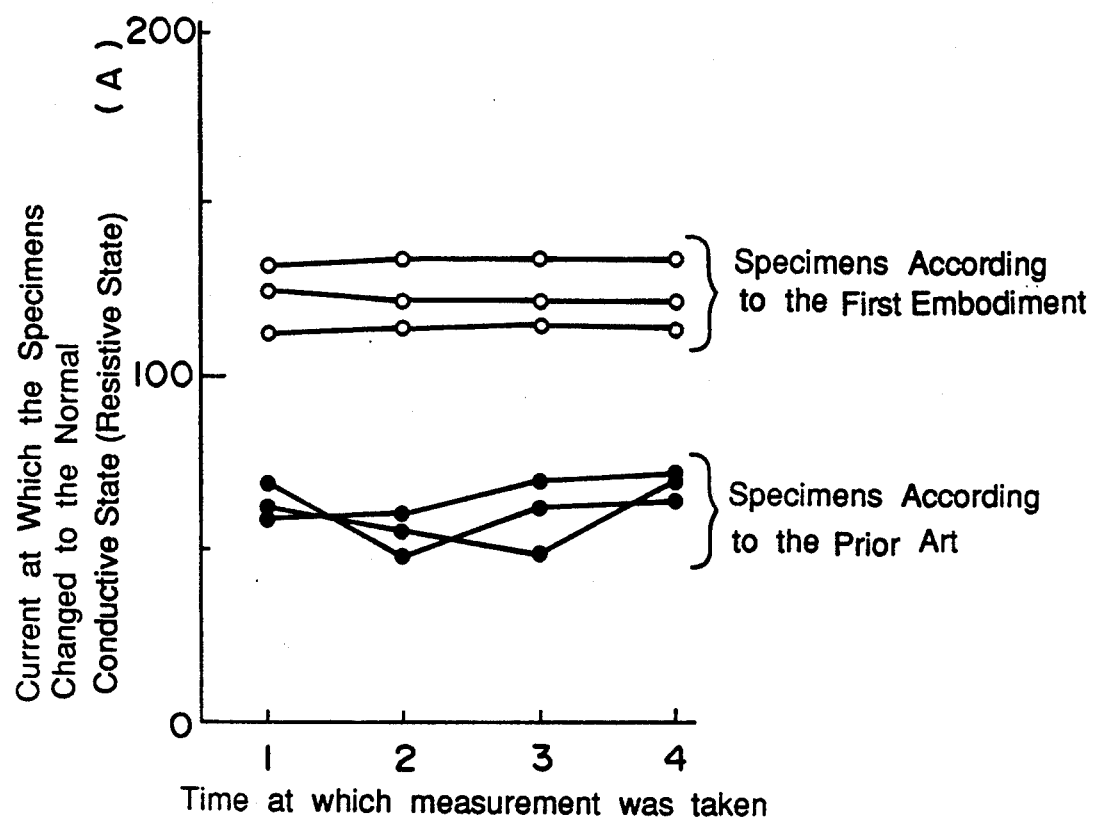
FIG. 7 is a graph comparing the current levels of the superconductive switches of the prior art (FIG. 1) and that of the present invention (FIG. 3), at which the transition from the superconducting state to the resisting state occurred.

In order to analyze the electrical features of the superconductive switch, an experiment was conducted. In the experiment, three specimens were prepared according to the above embodiment described with reference to FIGS. 3 through 6, and as a comparison, three specimens were prepared according to the prior art described with reference to FIGS. 1 and 2. The sole difference between the specimens of the embodiment and those of the prior art was whether the routes 1a and 1b were twisted around each other or not, while all other characteristics, for example, the dimensions and the compositions, were exactly the same. For each of the six specimens, electric current was allowed to flow four times, and the current values at which the specimens changed to the normal conductive condition (resistive condition) were measured. FIG. 7 shows the results of the experiment. In the drawing, the ordinate shows the current values at which the specimens changed to the normal conductive condition (resistive condition), while the abscissa shows the time at which the measurement was taken. The open circles designate the preferred embodiment, and the filled circles the prior art. It is easy to appreciate that in the specimens according to the preferred embodiment, the current flow is markedly improved.

In summary, according to the foregoing embodiment, even if the superconductive switch is subjected to magnetic fields from external magnetic sources, the opposite electromagnetic forces exerted by the routes 1a and 1b cancel each other by virtue of the routes 1a and 1b being twisted around each other. That is, in each twist pitch, each superconductive route restrain the movement of the other superconductive route. Accordingly, the wire-movements caused by the electromagnetic forces are restrained.

As a result, the current properties of the superconductive switch can be stable; that is, a large current which is close to the critical current of the superconductive wire can flow through the superconductive switch for long periods. In addition, the improvement of the electrical properties and the ease of manufacturing the superconductive switch may contribute to producing a light and compact superconductive switch at a reasonable cost. Also, since the wire-movement is restrained in the embodiment, the probability of the superconductive switch unexpectedly changing to the normal conductive condition (resistive condition) will be markedly reduced, thereby enhancing the reliability of the superconductive switch.

SECOND EMBODIMENT

Figure 8:
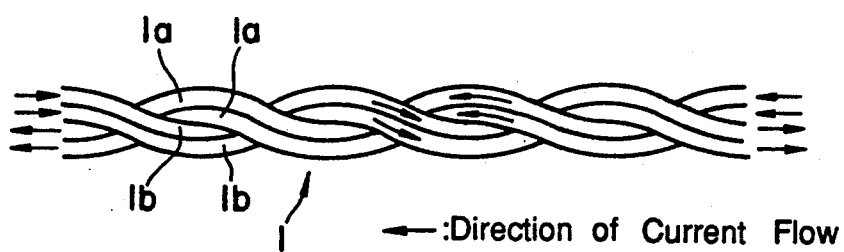
FIG. 8 is a schematic view of a pair of superconductive wires used in a superconductive switch according to a second embodiment of the present invention.

While in the preceding embodiment the superconductive wire 1 is constituted of a pair of superconductive routes 1a and 1b, the present invention is not intended to be so limited. It is apparent that the above effects can be obtained if the superconductive wire is constituted of pairs of superconductive routes twisted around each other. In this case, the insulation 6 (the outermost layer of the superconductive routes 1a and 1b) may be separately provided on the superconductive routes 1a and 1b. Alternatively, superconductive routes 1a or 1b, wherein current flows in the same direction, can be bound together, and such insulation 6 may be provided only between the opposite superconductive wires 1a and 1b. FIG. 8 depicts a superconductive wire 1 according to a second embodiment of the present invention. In this embodiment, four superconductive routes 1a and 1b (i.e., two superconductive routes 1a, and two superconductive routes 1b) are twisted with one another at a regular pitch. In this case, the insulation 6 may be separately provided.

THIRD EMBODIMENT

Figure 9:
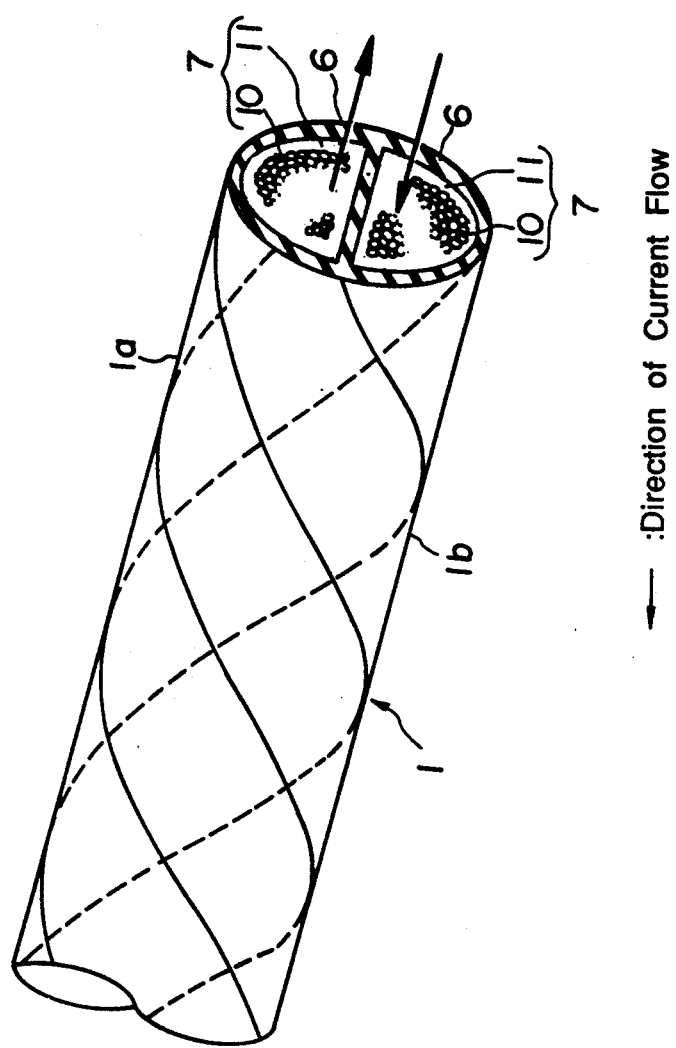
FIG. 9 is a perspective view showing a cross section of a superconductive wire used in a superconductive switch according to a third embodiment of the present invention.

FIG. 9 depicts a third embodiment of the present invention. In this embodiment, each of the superconductive routes 1a and 1b are formed to be of a semicircular cross section. The superconductive routes 1a and 1b are twisted around each other in such a manner that the longitudinal planar surfaces of the respective routes 1a and 1b are in contact with each other. In the drawing, reference numeral 7 designates the conductive part of the superconductive wire 1 (including the superconductive filaments and the matrix), while reference numeral 6 designates the above-described insulation material for insulating the respective conductive parts 7 from each other.

With such a structure, the whole superconductive wire 1 can be formed to be of a circular cross section. Therefore, when the superconductive wire 1 is wound around the cylindrical core 2 to form the superconductive switch in a manner similar to that shown in FIGS. 3 through 5, the actual packing of the superconductive filaments 10 in the wires 1 is enhanced. In other words, this structure contributes to the production of a compact superconductive switch. In addition, slipping of one of the superconductive routes 1a or 1b relative to the other can be prevented, so that wire-movement is further restrained. Furthermore, the superconductive wire 1 of the present embodiment does not have any concave or convex portions at the side surface. In other words, the stability of the superconductive route 1a and 1b on the core 2 is improved. Such twisted loop of the superconductive wire 1 may preferably be made by lateral compression molding after twisting of the routes 1a and 1b. In this case, the packing of the superconductive portions 7 can be increased.

FOURTH EMBODIMENT

Figure 10:
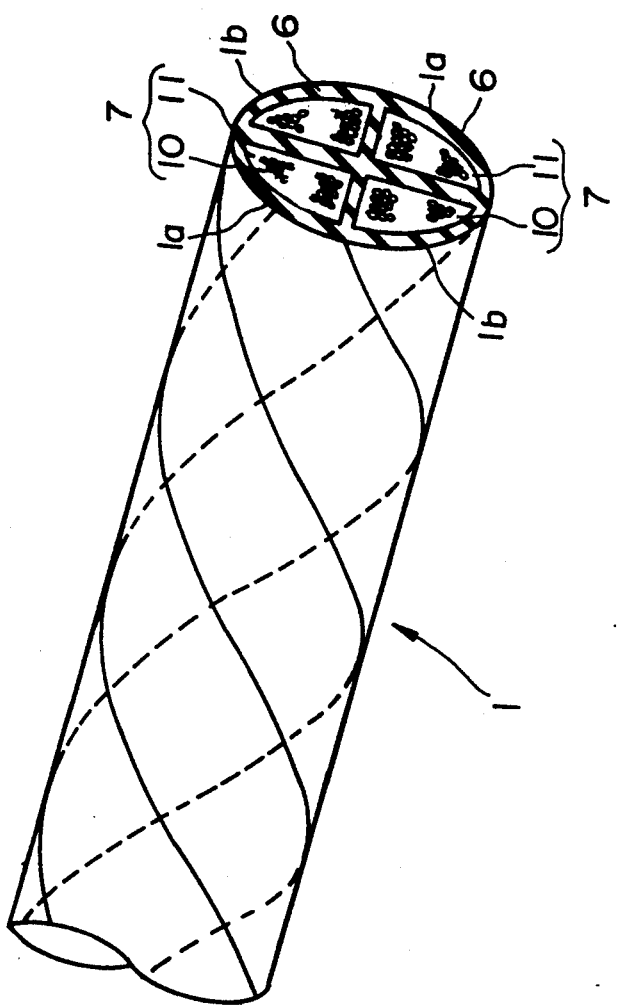
FIG. 10 is a perspective view showing a cross section of a superconductive wire used in a superconductive switch according to a fourth embodiment of the present invention.

FIG. 10 is a perspective view of a superconductive wire used in a superconductive switch in accordance with a fourth embodiment of the present invention. The fourth embodiment is an improvement of the second embodiment shown in FIG. 8. In this case, the conductive parts 7 (superconductive routes 1a and 1b) are of a sectorial shape which is a quarter of a circle. In the drawing, the superconductive routes 1a are disposed on a diagonal line of the cross section, while the superconductive routes 1b are also disposed on another diagonal line. This twisted loop of the superconductive wire 1 also may be preferably made by lateral compression molding after twisting of the routes 1a and 1b.

With this embodiment, advantages similar to those of the third embodiment shown in FIG. 9 may be obtained. In addition, as a result of the structure, a pair of superconductive switches can be assembled with one cylindrical core 2 because of the four conductive parts 7 which constitute a pair of superconductive wires 1.

FIFTH EMBODIMENT

Figure 11:
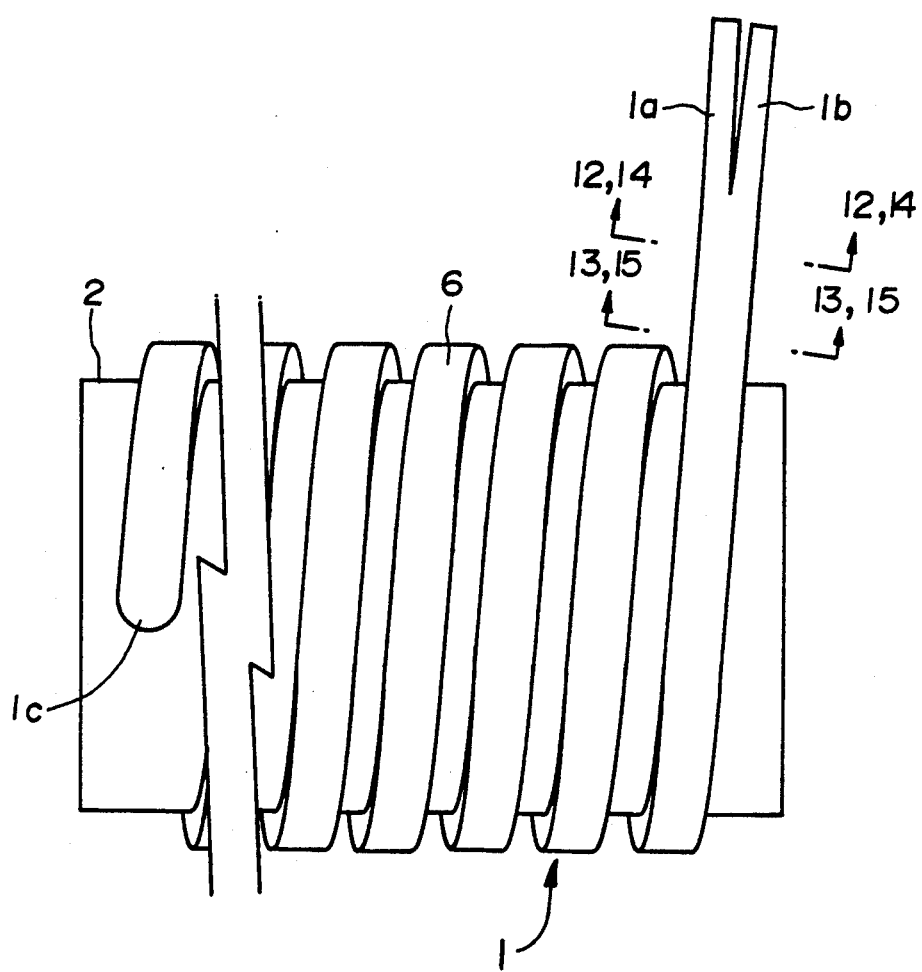
FIG. 11 is a side view of a superconductive switch according to fifth and sixth embodiments of the present invention, in which illustration of the heater line, the receiving material, and the casing is omitted.
Figure 12:
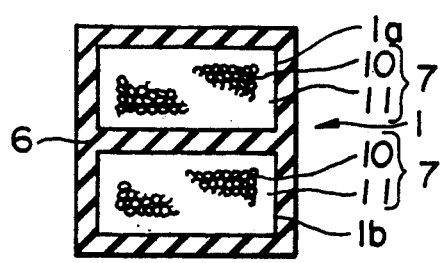
FIG. 12 is a cross section taken along line 12—12 in FIG. 11 of a superconductive wire used in a superconductive switch according to a fifth embodiment of the present invention.
Figure 13:
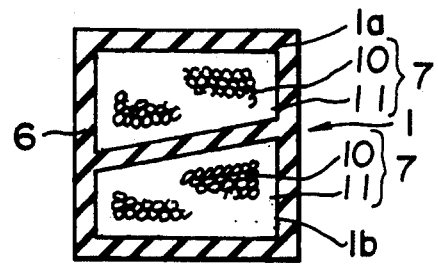
FIG. 13 is another cross-section taken along line 13—13 in FIG. 11 of the superconductive wire in FIG. 12.

FIG. 11 is a side view of a superconductive switch according to a fifth embodiment of the present invention. Illustration of the heater line 3, the receiving material 4, and the casing 5 is omitted. FIG. 12 depicts a cross section of a superconductive wire 1 taken along line 12—12 in FIG. 11, and FIG. 13 depicts another cross section taken along line 13—13 in FIG. 11. In this case, a pair of superconductive routes 1a and 1b of rectangular cross sections are twisted around each other, and then the twisted loop of the superconductive wire 1 is molded by lateral compression, so that the resulting cross section of the superconductive wire 1 is of a square shape.

At certain portions of the superconductive wire 1, for example, at a portion along the line 12—12 in FIG. 11, each of a pair of superconductive routes 1a and 1b is of the same rectangular cross section as shown in FIG. 12. At other portions of the superconductive wire 1, for example, at a portion along the line 13—13 in FIG. 11, each of a pair of superconductive routes 1a and 1b is distorted in a complementary manner as a result of the twisting and the lateral compression compacting, as shown in FIG. 13.

With such a structure, advantages similar to those of the third embodiment shown in FIG. 9 may be obtained. In addition, since the superconductive wire 1 is of a square cross section, one of the planar side surfaces of the superconductive wire 1 is in contact with the cylindrical core 2. Therefore, the stability of the superconductive wire 1 on the cylindrical core 2 can be improved, so that the wire-movement can be restrained. Furthermore, the density of the conductive parts 7 at each pitch can be increased in comparison with the preceding embodiments in which the wires were of circular cross section.

SIXTH EMBODIMENT

Figure 14:
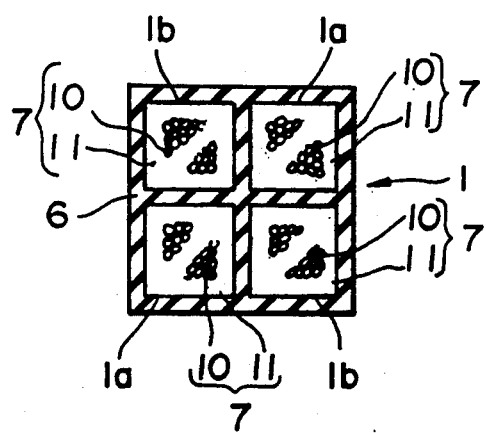
FIG. 14 is a cross section taken along line 14—14 in FIG. 11 of a superconductive wire used in a superconductive switch according to a sixth embodiment of the present invention.
Figure 15:
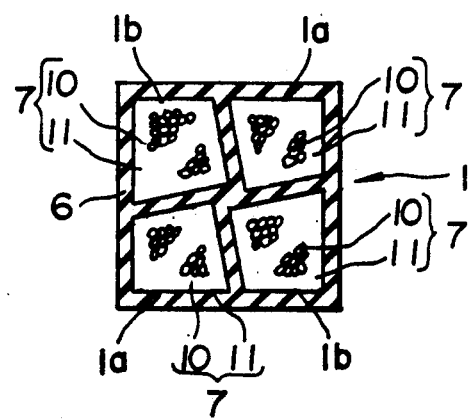
FIG. 15 is another cross section taken along line 15—15 in FIG. 11 of the superconductive wire in FIG. 14.

Again, FIG. 11 is a side view of a superconductive switch according to a sixth embodiment of the present invention. FIG. 14 depicts a cross section of a superconductive wire 1 taken along line 14—14 in FIG. 11, and FIG. 15 depicts another cross section taken along line 15—15 in FIG. 11. The sixth embodiment is also an improvement of the second embodiment shown in FIG. 8. In this case, two pairs of conductive parts 7 (superconductive routes 1a and 1b), of a square shape, are twisted around each other, and then the twisted loop of the superconductive wire 1 is molded by lateral compression molded, so that the resulting cross section of the superconductive wire 1 is of a square shape.

At certain portions of the superconductive wire 1, for example, at a portion along the line 14—14 in FIG. 11, each of a pair of superconductive routes 1a and 1b is of the same square cross section as shown in FIG. 14. At other portions of the superconductive wire 1, for example, at a portion along the line 15—15 in FIG. 11, each of a pair of superconductive routes 1a and 1b is distorted in a complementary manner as a result of the twisting and the lateral compression compacting, as shown in FIG. 15. In the drawings, the superconductive routes 1a are disposed on a diagonal line of the cross section while the superconductive routes 1b are also disposed on another diagonal line.

With such a structure, advantages similar to those of the fifth embodiment shown in FIGS. 12 and 13 can be obtained. In addition, as a result of the structure, a pair of superconductive switches can be assembled with one cylindrical core 2 because of the four conductive parts 7 which constitute a pair of superconductive wires 1.

SEVENTH EMBODIMENT

Figure 16:
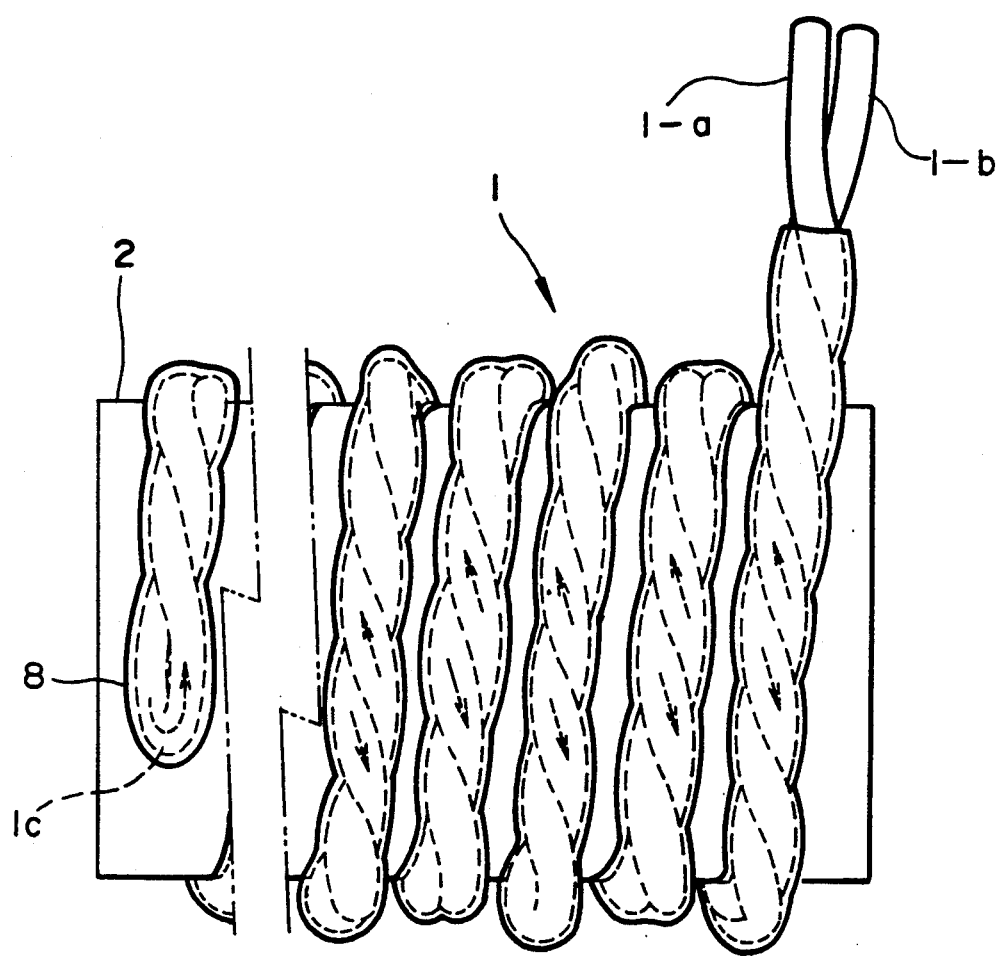
FIG. 16 is a side view of a superconductive switch according to a seventh embodiment of the present invention, in which illustration of the heater line, the receiving material, and the casing is omitted.

FIG. 16 is a side view of a superconductive switch according to a seventh embodiment of the present invention. The seventh embodiment is an improvement of the first embodiment described above with reference to FIGS. 3 and 4. In the drawing, illustration of the heater line 3, the receiving material 4, and the casing 5 is omitted as they are similar to those shown in FIG. 3. In the present embodiment, the twisted superconductive wire 1 is entirely covered with a covering adhesive tape 8 as a means to confine the twisted superconductive wire 1 as illustrated in FIG. 16. The adhesive tape is porous, although this porosity is not illustrated. In this case, the movements of the interior filaments 10 can be further confined. The covering tape 8 may be substituted by other mechanically restraining materials, for example, textiles, fabrics, nets, strands, filaments, or fibers. In the following, the substitutions of the seventh embodiment are described.

EIGHTH EMBODIMENT

Figure 17:
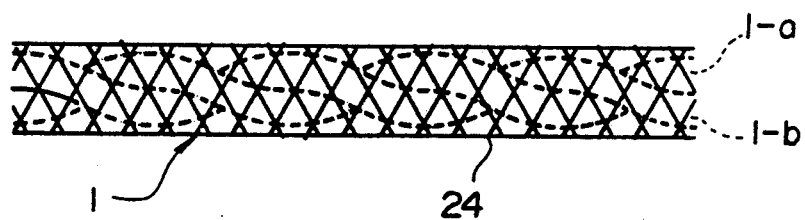
FIG. 17 is a side view of a superconductive wire used in a superconductive switch according to an eighth embodiment of the present invention.

FIG. 17 is a side view of a superconductive wire used in a superconductive switch according to an eighth embodiment of the present invention. In this embodiment, in each winding, the superconductive wire 1 is covered with a net or fabric 24 which confines the twisted superconductive wire 1.

NINTH EMBODIMENT

Figure 18:
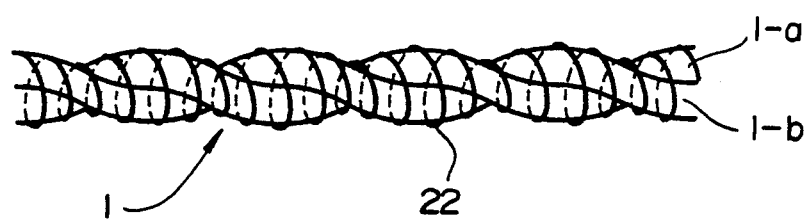
FIG. 18 is a side view of a superconductive wire used in a superconductive switch in accordance with a ninth embodiment of the present invention.

FIG. 18 is a side view of a superconductive wire used in a superconductive switch in accordance with a ninth embodiment of the present invention. In this embodiment, in order to restrain the twisted superconductive wire 1, a filament 22 is wound around the twisted superconductive wire.

TENTH EMBODIMENT

Figure 19:
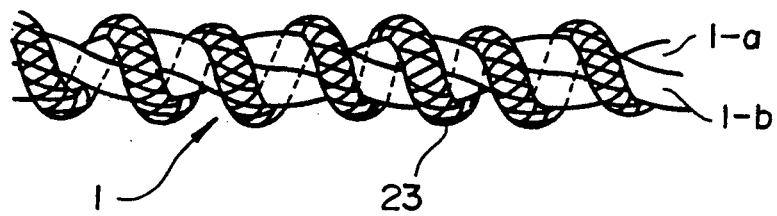
FIG. 19 is a side view of a superconductive wire used in a superconductive switch according to a tenth embodiment of the present invention.

FIG. 19 is a side view of a superconductive wire used in a superconductive switch according to a tenth embodiment of the present invention. In this embodiment, in order to restrain the twisted superconductive wire 1, a slim adhesive tape 23 is wound around the twisted superconductive wire.

ELEVENTH EMBODIMENT

Figure 20:
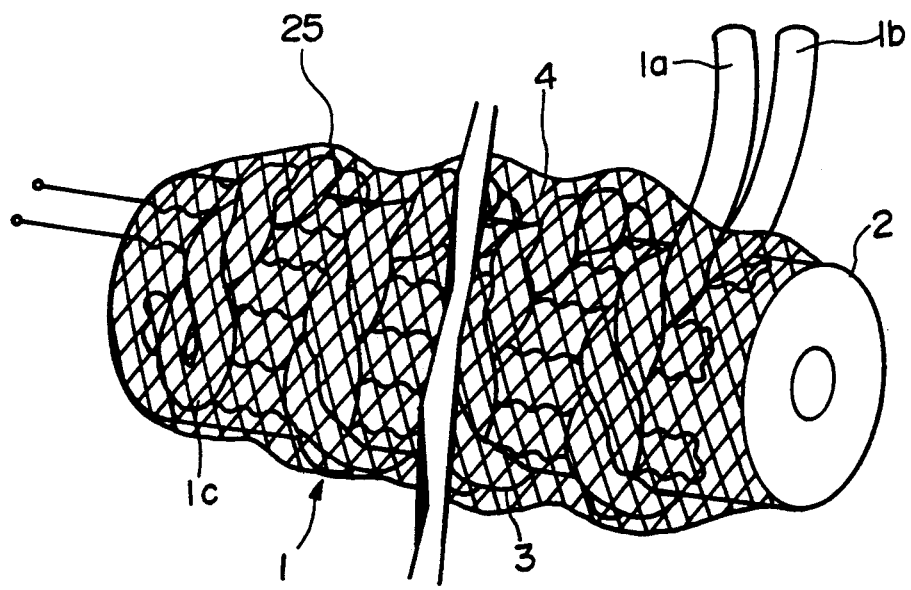
FIG. 20 is a perspective view of a superconductive switch according to a eleventh embodiment of the present invention, in which illustration of the casing is omitted.

FIG. 20 is a perspective view of a superconductive switch according to an eleventh embodiment of the present invention, in which illustration of the aforementioned casing 5 is omitted. In this embodiment, the receiving material 4 is entirely covered with a confinement net 25 which confines and restrains the twisted superconductive wire 1.

Although preferred embodiments of the present invention have been disclosed for illustrative purpose, those skilled in the art will appreciate that various modifications, additions, and substitutions are possible, without departing from the scope and spirit of the invention as stated in the accompanying claims.

What is claimed is:

1. A superconductive switch comprising:
    at least one pair of superconductive routes constituting a loop in a superconducting wire wound around a core and having members of the pair of superconductive routes twisted around each other, said at least one pair of superconductive routes having electric current flowing and reciprocating in opposite directions through the respective superconductive routes.

2. A superconductive switch according to claim 1, wherein a cross section of said superconducting wire is radially symmetric, each of the superconductive routes having a cross section of which the area is approximately the same as an area of a figure which is the radially symmetric figure divided by the number of the superconductive routes constituting the superconducting wire.

3. A superconductive switch according to claim 2, wherein a cross section of said superconducting wire is circular, each of the superconductive routes having a cross section of which the area is approximately the same as an area of the circular figure divided by the number of the superconductive routes constituting the superconducting wire.

4. A superconductive switch according to claim 3, wherein the cross section of each of the superconductive routes is semicircular, a planar surface of the semicircular figure of each of the superconductive routes facing to a planar surface of the semicircular figure of the other superconductive route.

5. A superconductive switch according to claim 2, wherein a cross section of said superconducting wire is rectangular, each of the superconductive routes having a cross section of which the area is approximately the same as an area of the rectangular figure divided by the number of the superconductive routes constituting the superconducting wire.

6. A superconductive switch according to claim 5, wherein a cross section of said superconducting wire is square, each of the superconductive routes having a cross section of which the area is approximately the same as an area of the square figure divided by the number of the superconductive routes constituting said loop in the superconducting wire.

7. A superconductive switch according to claim 1, wherein said superconducting wire is restrained by a mechanical restraining means which restrains movement of the respective superconductive wire.

8. A superconductive switch according to claim 7, wherein said mechanical restraining means is a tape.

9. A superconductive switch according to claim 7, wherein said mechanical restraining means is filaments or fiber strings.

10. A superconductive switch according to claim 7, wherein said mechanical restraining means is a net or textile.

11. A superconductive switch according to claim 1, wherein said superconductive routes are wound around said core in a bifilar fashion.

12. A superconductive switch according to claim 1, wherein said core is manufactured of a material having a thermal-shrinkage ratio less than that of the superconducting wire.

13. A superconductive switch according to claim 13, wherein said core is manufactured of quartz-glass-fiber reinforced plastic material.

14. A superconductive switch comprising:
    at least one pair of superconductive routes wound around a core in a bifilar fashion, characterized in that the superconductive routes are twisted around each other.

15. A method for producing a superconductive switch, the method comprising the steps of:
    (a) preparing at least one superconducting wire;
    (b) twisting said prepared superconductive wire so as to form at least one pair of superconductive routes, the superconductive routes constituting a loop in a superconducting wire and having electric current flowing and reciprocating in opposite directions through the respective superconductive routes; and
    (c) winding said superconducting wire around a core.

16. A method according to claim 15, further comprising, between said twisting step (b) and said winding step (c), the following step:
    (d) compressing laterally said superconducting wire, thereby uniting and confining the respective superconductive routes,
    wherein a cross section of said superconducting wire, through which electric current reciprocates, is radially symmetric, each of the superconductive routes having a cross section of which the area is approximately the same as an area of a figure which is the radially symmetric figure divided by the number of the superconductive routes constituting the superconducting wire.

17. A method according to claim 15, further comprising, between said twisting step (b) and said winding step (c), the following step:
    (e) restraining said superconducting wire by a mechanical restraining means which restrains movement of the respective superconductive routes.

18. A method according to claim 17, wherein said mechanical restraining means is a tape.

19. A method according to claim 17, wherein said mechanical restraining means is filaments or fiber strings.

20. A method according to claim 17, wherein said mechanical restraining means is a net or textile.

21. A superconductive switch comprising:
at least one pair of superconductive routes constituting a loop in a superconducting wire wound around a core and having electric current flowing and reciprocating in opposite directions through the respective superconductive routes, the superconductive routes being restrained by a mechanical restraining means which restrains movement of the respective superconductive routes.

22. A superconductive switch according to claim 21, wherein said mechanical restraining means is a tape.

23. A superconductive switch according to claim 21, wherein said mechanical restraining means is filaments or fiber strings.

24. A superconductive switch according to claim 21, wherein said mechanical restraining means is a net or textile.

25. A superconductive switch comprising:
at least one pair of superconductive routes wound around a core, the superconductive routes constituting a loop in a superconducting wire and having electric current flowing and reciprocating in opposite directions through the respective superconductive routes, wherein said core is manufactured of a material in which the thermal-shrinkage ratio is less than that of the superconductive wire.

26. A superconductive switch according to claim 25, wherein said core is manufactured of quartz-glass-fiber reinforced plastic material.

* * * * *